United States Patent
Jeon et al.

(10) Patent No.: US 11,944,001 B2
(45) Date of Patent: Mar. 26, 2024

(54) LUMINESCENT MATERIAL, METHOD OF PREPARING THE SAME, AND LIGHT-EMITTING DEVICE INCLUDING THE LUMINESCENT MATERIAL

(71) Applicant: Samsung Electronics Co., Ltd., Suwon-si (KR)

(72) Inventors: Hyunjeong Jeon, Seoul (KR); YongChul Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 559 days.

(21) Appl. No.: 17/196,940

(22) Filed: Mar. 9, 2021

(65) Prior Publication Data

US 2021/0336158 A1 Oct. 28, 2021

(30) Foreign Application Priority Data

Apr. 22, 2020 (KR) ........................ 10-2020-0048865

(51) Int. Cl.
| | |
|---|---|
| *H01L 51/50* | (2006.01) |
| *C07F 1/08* | (2006.01) |
| *C09D 5/22* | (2006.01) |
| *C09D 7/20* | (2018.01) |
| *C09K 11/06* | (2006.01) |
| *C09K 11/61* | (2006.01) |
| *H10K 85/30* | (2023.01) |
| *H10K 50/11* | (2023.01) |

(Continued)

(52) U.S. Cl.
CPC ............ *H10K 85/371* (2023.02); *C07F 1/08* (2013.01); *C09D 5/22* (2013.01); *C09D 7/20* (2018.01); *C09K 11/06* (2013.01); *C09K 11/616* (2013.01); *C09K 2211/1007* (2013.01); *H10K 50/11* (2023.02); *H10K 50/15* (2023.02); *H10K 50/16* (2023.02)

(58) Field of Classification Search
None
See application file for complete search history.

(56) References Cited

U.S. PATENT DOCUMENTS

| | | |
|---|---|---|
| 2018/0233688 A1 | 8/2018 | Chen et al. |
| 2021/0066635 A1 | 3/2021 | Kim |
| 2021/0115329 A1* | 4/2021 | Saparov ................ H01L 33/502 |

FOREIGN PATENT DOCUMENTS

| | | |
|---|---|---|
| CN | 105870349 A | 8/2016 |
| CN | 110117024 A | 8/2019 |
| KR | 1020210027055 A | 3/2021 |

OTHER PUBLICATIONS

Bat-El Cohen et al., "High Efficiency and High Open Circuit Voltage in Quasi 2D Perovskite Based Solar Cells, " Adv. Funct. Mater. 2017, pp. 1-7 (1604733).

(Continued)

*Primary Examiner* — Gregory D Clark
(74) *Attorney, Agent, or Firm* — CANTOR COLBURN LLP

(57) ABSTRACT

A luminescent material, including a first compound represented by Formula 1 and a second compound represented by Formula 2:

$$[A][Cu][X]_3 \qquad \text{Formula 1}$$

$$R_{21}R_{22}R_{23}N \qquad \text{Formula 2}$$

wherein, in Formulae 1 and 2, A, X, and $R_{21}$ to $R_{23}$ are understood by referring to the definitions thereof provided in the detailed description of the specification.

20 Claims, 3 Drawing Sheets

(51) Int. Cl.
H10K 50/15 (2023.01)
H10K 50/16 (2023.01)

(56) References Cited

OTHER PUBLICATIONS

Daniele Cortecchia et al., "Lead-Free MA2CuClxBr4-x Hybrid Perovskites," Inorganic Chemistry, Jan. 12, 2016, pp. 1044-1052, vol. 55.

Hyeong Pil Kim et al., "High-Efficiency, Blue, Green, and Near-Infrared Light-Emitting Diodes Based on Triple Cation Perovskite," Adv. Optical Mater. Feb. 2, 2017, pp. 1-9 (1600920).

Jun Xing et al., "Color-stable highly luminescent sky-blue perovskite light-emitting diodes," Nature Communications, 2018, pp. 1-8.

Loredana Protesescu et al., "Nanocrystals of Cesium Lead Halide Perovskites (CsPbX3, X = Cl, Br, and I): Novel Optoelectronic Materials Showing Bright Emission with Wide Color Gamut," Nano Letters, Jan. 29, 2015, pp. 3692-3696, vol. 15.

Meiying Leng et al., "Lead-Free, Blue Emitting Bismuth Halide Perovskite Quantum Dots," Communications, Oct. 28, 2016, pp. 15012-15016, vol. 55.

Muhammad Aamir et al., "A facile approach for selective and sensitive detection of aqueous contamination in DMF by using perovskite material," Materials Letters, Jul. 19, 2016, pp. 135-138, vol. 183.

Tao Fang et al., "Recent advances and prospects toward blue perovskite materials and light-emitting diodes," Info Mat., 2019, pp. 211-233.

Xiaolei Li et al., "(C6H5CH2NH3)2CuBr4: A Lead-Free, Highly Stable Two-Dimensional Perovskite for Solar cell Applications," ACS Applied Energy Materials, May 25, 2018, pp. 1-26.

Yo-Han Suh et al., "High-Performance CsPbX3 Perovskite Quantum-Dot Light-Emitting Devices via Solid-State Ligand Exchange," ACS Appl. Nano Mater., Jan. 12, 2018, pp. 488-496, vol. 1, Issue 2.

\* cited by examiner

LUMINESCENT MATERIAL, METHOD OF PREPARING THE SAME, AND LIGHT-EMITTING DEVICE INCLUDING THE LUMINESCENT MATERIAL

CROSS-REFERENCE TO RELATED APPLICATION

This application claims priority to and the benefit of Korean Patent Application No. 10-2020-0048865, filed on Apr. 22, 2020, in the Korean Intellectual Property Office, and all the benefits accruing therefrom under 35 U.S.C. § 119, the content of which is incorporated herein in its entirety by reference.

BACKGROUND

1. Field

One or more embodiments of the present disclosure relate to a luminescent material, a method of preparing the luminescent material, and a light-emitting device including the luminescent material.

2. Description of Related Art

Light-emitting devices are devices that convert electrical energy into light energy.

For example, a simple light-emitting device includes an anode, a cathode, and an emission layer between the anode and the cathode. Additionally, a hole transport region may be disposed between the anode and the emission layer, and an electron transport region may be disposed between the emission layer and the cathode. Holes provided from the anode may move toward the emission layer through the hole transport region, while the electrons provided from the cathode may move toward the emission layer through the electron transport region. The holes and the electrons recombine in the emission layer to produce excitons. These excitons transit from an excited state to a ground state to thereby generate light.

SUMMARY

One or more embodiments include a novel luminescent material, a method of preparing the luminescent material, and a light-emitting device including the luminescent material. In detail, one or more embodiments include a novel luminescent material not including lead, a method of preparing the luminescent material, and a light-emitting device including the luminescent material.

Additional aspects will be set forth in part in the description which follows and, in part, will be apparent from the description, or may be learned by practice of the presented embodiments of the disclosure.

According to one or more embodiments, a luminescent material includes a first compound represented by Formula 1 and a second compound represented by Formula 2:

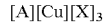  Formula 1

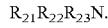  Formula 2 wherein, in Formulae 1 and 2,

A is $R_{11}R_{12}R_{13}C$, $R_{11}R_{12}R_{13}R_{14}N$, $R_{11}R_{12}N=C(R_{13})-NR_{14}R_{15}$, Li, Na, K, Cs, Rb, Fr, or any combination thereof, X is F, Cl, Br, I, or any combination thereof, $R_{11}$ to $R_{15}$ are each independently hydrogen, deuterium, $-N(Q_{11})(Q_{12})$, a $C_1$-$C_3$ alkyl group, a $C_2$-$C_3$ alkenyl group, a $C_2$-$C_3$ alkynyl group, or a $C_1$-$C_3$ alkoxy group, $Q_{11}$ and $Q_{12}$ are each independently hydrogen, deuterium, a $C_1$-$C_3$ alkyl group, a $C_2$-$C_3$ alkenyl group, a $C_2$-$C_3$ alkynyl group, or a $C_1$-$C_3$ alkoxy group, and $R_{21}$ to $R_{23}$ are each independently hydrogen, deuterium, a substituted or unsubstituted $C_1$-$C_{10}$ alkyl group, a substituted or unsubstituted $C_6$-$C_{20}$ aryl group, and a substituted or unsubstituted $C_7$-$C_{20}$ arylalkyl group, wherein at least one of $R_{21}$ to $R_{23}$ is selected from a substituted or unsubstituted $C_1$-$C_{10}$ alkyl group, a substituted or unsubstituted $C_6$-$C_{20}$ aryl group, or a substituted or unsubstituted $C_7$-$C_{20}$ arylalkyl group, and two substituents from $R_{21}$ to $R_{23}$ are optionally linked to each other to form a ring.

In one or more embodiments, the luminescent material may be a composition, such as a mixture of the first compound and the second compound.

In one or more embodiment, the first compound may form a crystal, and the second compound may not be included in the crystal of the first compound.

In one or more embodiments, an amount of the second compound in the luminescent material may be more than about 0 wt %, based on the total weight of the luminescent material.

In one or more embodiments, the amount of the second compound in the luminescent material may be from about 10 wt % or more to about 90 wt % or less, based on the total weight of the luminescent material.

In one or more embodiments, $R_{11}$ to $R_{15}$ may each independently be hydrogen, deuterium, $-N(Q_{11})(Q_{12})$, a methyl group, an ethyl group, an iso-propyl group, an n-butyl group, an iso-butyl group, a sec-butyl group, a methoxy group, an ethoxy group, an iso-propoxy group, an n-butoxy group, an iso-butoxy group, or a sec-butoxy group, and $Q_{11}$ and $Q_{12}$ may each independently be hydrogen, deuterium, methyl group, an ethyl group, an iso-propyl group, an n-butyl group, an iso-butyl group, a sec-butyl group, a methoxy group, an ethoxy group, an iso-propoxy group, an n-butoxy group, an iso-butoxy group, or a sec-butoxy group.

In one or more embodiments, A may be $NH_4$, $CH_3NH_3$, $C_2H_5NH_3$, $(CH_3)_2NH_2$, $CH(NH_2)_2$, Li, Na, K, Rb, Cs, Fr, or any combination thereof.

In one or more embodiments, the first compound may be $CsCuBr_3$, $CH_3NH_3CuBr_3$, $CH(NH_2)_2CuBr_3$, or any combination thereof.

In one or more embodiments, $R_{21}$ to $R_{23}$ may each independently be:

hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, a phenyl group, a naphthyl group, a benzyl group, a phenylethyl group, a phenylpropyl group, or a phenylbutyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, or an n-decyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a naphthyl group, a benzyl group, a phenylethyl group, a phenylpropyl group, or a phenylbutyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group, wherein at least one of $R_{21}$ to $R_{23}$ may be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, a phenyl group, a naphthyl group, a benzyl group, a phenylethyl group, a phenylpropyl group, or a phenylbutyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, or an n-decyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a naphthyl group, a benzyl group, a phenylethyl group, a phenylpropyl group, or a phenylbutyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group.

In one or more embodiments, $R_{21}$ to $R_{23}$ may each independently be:

hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group, wherein at least one of $R_{21}$ to $R_{23}$ may be:

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group;

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group.

In one or more embodiments, the second compound may include propylamine, butylamine, isobutylamine, aniline, phenylmethylamine, phenylethylamine, or any combination thereof.

In one or more embodiments, a maximum luminescence wavelength of the luminescent material may be from about 420 nanometers (nm) or greater to about 520 nm or less.

In one or more embodiments, a full width at half maximum of the luminescent material may be about 100 nm or less.

According to one or more embodiments, a method of preparing a luminescent material including a first compound represented by Formula 1 and a second compound represented by Formula 2 includes: providing a composition on a substrate, the composition including at least one A precursor, at least one Cu precursor, a second compound represented by Formula 2, and a solvent; adding an anti-solvent to the composition; crystallizing the composition; and removing the solvent and the anti-solvent from the crystallized composition by heat treatment:

          Formula 1

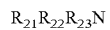          Formula 2 wherein, in Formulae 1 and 2,

A is $R_{11}R_{12}R_{13}C$, $R_{11}R_{12}N=C(R_{13})-NR_{14}R_{15}$, Li, Na, K, Cs, Rb, Fr, or any combination thereof, X is F, Cl, Br, I, or any combination thereof, $R_{11}$ to $R_{15}$ are each independently hydrogen, deuterium, $-N(Q_{11})(Q_{12})$, a $C_1$-$C_3$ alkyl group, a $C_2$-$C_3$ alkenyl group, a $C_2$-$C_3$ alkynyl group, or a $C_1$-$C_3$ alkoxy group, $Q_{11}$ and $Q_{12}$ are each independently hydrogen, deuterium, a $C_1$-$C_3$ alkyl group, a $C_2$-$C_3$ alkenyl group, a $C_2$-$C_3$ alkynyl group, or a $C_1$-$C_3$ alkoxy group, and $R_{21}$ to $R_{23}$ are each independently hydrogen, deuterium, a substituted or unsubstituted $C_1$-$C_{10}$ alkyl group, a substituted or unsubstituted $C_6$-$C_{20}$ aryl group, or a substituted or unsubstituted $C_7$-$C_{20}$ arylalkyl group, wherein at least one of $R_{21}$ to $R_{23}$ is a substituted or unsubstituted $C_1$-$C_{10}$ alkyl group, a substituted or unsubstituted $C_6$-$C_{20}$ aryl group, or a substituted or unsubstituted $C_7$-$C_{20}$ arylalkyl group, and two substituents from $R_{21}$ to $R_{23}$ are optionally linked to each other to form a ring.

In one or more embodiments, an amount of the second compound in the composition may be more than about 0 wt %.

In one or more embodiments, a molar ratio of the at least one A precursor to the at least one Cu precursor in the composition may be about 0.7:1 to about 1:0.7.

In one or more embodiments, the solvent may be dimethyl formamide, dimethyl sulfoxide, γ-butyrolactone, N-methyl-2-pyrrolidone, or any combination thereof, and the anti-solvent may be diethyl ether, toluene, α-terpineol, hexyl carbitol (diethylene glycol hexyl ether), butyl carbitol acetate (diethylene glycol n-butyl ether acetate), hexyl cellosolve (ethylene glycol monohexyl ether), butyl cellosolve acetate (ethylene glycol n-butyl ether acetate), or any combination thereof.

According to one or more embodiments, a light-emitting device includes: a first electrode; a second electrode opposite to and facing the first electrode; an emission layer between the first electrode and the second electrode, wherein the emission layer includes the luminescent material as disclosed herein.

In one or more embodiments, the light-emitting device 1 may further include a hole transport region between the first electrode 110 and the emission layer 150, an electron transport region between the emission layer 150 and the second electrode 190, or the light-emitting device 1 may further include both a hole transport region between the first electrode 110 and the emission layer 150 and an electron transport region between the emission layer 150 and the second electrode 190.

In one or more embodiments, the light-emitting device may further include a charge control layer between the first electrode and the emission layer, between the emission layer and the second electrode, or the light-emitting device may further include both a charge control layer between the first electrode and the emission layer and between the emission layer and the second electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
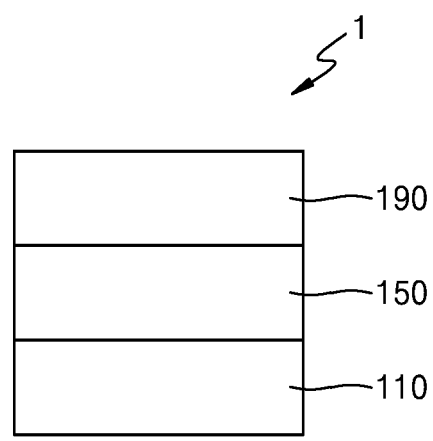
FIG. 1 is a schematic cross-sectional view of an exemplary embodiment of a light-emitting device.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, exemplary embodiments are described below, and by referring to the drawings, to explain various aspects. In the drawings, the sizes of elements may be exaggerated or reduced for ease of description. As used herein, the term "and/or" includes any and all combinations of one or more of the associated listed items. Expressions such as "at least one of," when preceding a list of elements, modify the entire list of elements and do not modify the individual elements of the list.

General and widely-used terms have been employed herein, in consideration of functions provided and/or used in the present disclosure, and may vary according to, for example, an intention of a person of ordinary skilled in the art, a precedent, or the emergence of new technologies. In addition, in some cases, the applicant may arbitrarily select specific terms. Then, the applicant, will provide the meaning of the terms in the detailed description of the present disclosure. Accordingly, it will be understood that the terms used herein should be interpreted as having meanings that are consistent with their meanings in the context of the relevant art and shall not be interpreted in an idealized or overly formal sense unless expressly defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will also be understood that when an element such as a layer, a region, or a component is referred to as being "on" another element, it can be "directly on" the other element, or intervening layers, regions, or components may also be present. For example, when a portion of a layer, film, region, plate, etc. is said to be "on" another portion, this includes not only the case in which the portion is "directly on" another portion, but also the case in which an intervening layer is placed therebetween. When a first portion is placed "directly on" a second portion, there is no intervening layer between the first portion and the second portion.

Although the terms "first", "second", etc., may be used herein to describe various elements, components, regions, and/or layers, these elements, components, regions, and/or layers should not be limited by these terms. These terms are used only to distinguish one component from another, not for purposes of limitation.

In the present specification, the singular form includes the plural form unless defined otherwise.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The term "perovskite" as used herein refers to a crystalline compound represented by, for example, the formula AB'X$_3$, wherein A and B' are cations having different sizes, and X is an anion. In the unit cell of the perovskite compound, a site of the first cation A may be positioned at (0,0,0), a site of the second cation B' may be positioned at (1/2,1/2,1/2), and the anion X may be positioned at (1/2,1/2,0). The term "perovskite" as used herein is understood as encompassing not only the ideal symmetric structure of CaTiO$_3$, but also a compound having a perovskite-like structure such as a twisted structure having less symmetry than the ideal symmetric structure of CaTiO$_3$. It will be understood that the perovskite compound used herein may encompass a compound having the ideal symmetric structure and a compound having a twisted structure with lower symmetry depending on types of A, B', and X.

The term "maximum luminescence wavelength" as used herein refers to a wavelength value corresponding to a point having a maximum luminescence intensity in a photoluminescence (PL) spectrum of a solution or film sample including a compound.

The term "full width at half maximum (FWHM)" as used herein refers to a wavelength width of a point corresponding to ½ of the maximum luminescence wavelength in the PL spectrum.

The term "C$_1$-C$_3$ alkyl group" as used herein refers to a branched or unbranched (or a straight or linear) completely saturated aliphatic hydrocarbon monovalent group having 1 to 3 carbon atoms, and includes a methyl group, an ethyl group, and a propyl group. The term "C$_1$-C$_{10}$ alkyl group" as used herein refers to a branched or unbranched (or a straight or linear) completely saturated aliphatic hydrocarbon monovalent group having 1 to 10 carbon atoms. Non-limiting examples of the C$_1$-C$_{10}$ alkyl group may include a methyl group, an ethyl group, a n-propyl group, an isopropyl group, a n-butyl group, an isobutyl group, a sec-butyl group, a t-butyl group, an isopentyl group, a neopentyl group, an iso-amyl group, a n-hexyl group, a 3-methylhexyl group, a 2,2-dimethylpentyl group, a 2,3-dimethylpentyl group, and a n-heptyl group.

The term "C$_2$-C$_3$ alkenyl group" as used herein refers to an aliphatic hydrocarbon group including at least one carbon-carbon double bond in the middle or at the terminus of a C$_2$-C$_3$ alkyl group, and examples thereof include an ethenyl group, a propenyl group, and the like.

The term "C$_2$-C$_3$ alkynyl group" as used herein refers to an aliphatic hydrocarbon group including at least one carbon-carbon triple bond in the middle or at the terminus of a C$_2$-C$_3$ alkyl group, and examples thereof include an ethynyl group, a propynyl group, and the like.

The term "C$_1$-C$_3$ alkoxy group" as used herein refers to a monovalent group represented by –OA$_{101}$ (wherein A$_{101}$ is a C$_1$-C$_3$ alkyl group), and includes a methoxy group, an ethoxy group, and an isopropyloxy group.

The term "C$_6$-C$_{20}$ aryl group" as used herein refers to a monovalent group having a carbocyclic aromatic system having 6 to 20 carbon atoms. Examples of the C$_6$-C$_{20}$ aryl group include a phenyl group, a naphthyl group, an anthracenyl group, a phenanthrenyl group, a pyrenyl group, a chrysenyl group, and the like. When the C$_6$-C$_{20}$ aryl group includes two or more rings, the two or more rings may be fused to each other.

The term "C$_7$-C$_{20}$ arylalkyl group" as used herein refers to a group represented by -A$_{102}$A$_{103}$ (wherein A$_{102}$ is a substituted C$_1$-C$_{14}$ alkyl group, and A$_{103}$ is a C$_6$-C$_{19}$ aryl group).

At least one hydrogen atom of the foregoing groups may be substituted with a halogen atom, a C$_1$-C$_{20}$ alkyl group substituted with a halogen atom (for example, CF$_3$, CH$_3$CF$_2$, CH$_2$F, CCl$_3$, and the like), a C$_1$-C$_{20}$ alkoxy group, a C$_2$-C$_{20}$ alkoxyalkyl group, a hydroxyl group (—OH), a nitro group (—NO$_2$), a cyano group (—CN), an amino group (—NH$_2$), an alkylamino group (RNH—, wherein R is a C$_1$-C$_{10}$ alkyl group), a dialkylamino group (R$_2$NH—, wherein each R is the same or different C$_1$-C$_{10}$ alkyl group), an amidino group (—C(=NH)NH$_2$), a hydrazino group (—NHNH$_2$), a hydrazono group (=N—NH$_2$), a carbamoyl group (—C(O)NH$_2$), a carboxyl group or a salt thereof (—C(=O)OX, wherein X is a hydrogen or a cation), a sulfonyl group (—S(=O)$_2$), a sulfamoyl group (NH$_2$—SO$_2$—), a sulfonic acid group or a salt thereof ((—SO$_3$X$_2$ wherein X is a hydrogen or a cation), a phosphoric acid or a salt thereof (PO$_3$X$_2$ wherein X is a hydrogen or a cation), a tosyl group (CH$_3$C$_6$H$_4$SO$_2$—), a C$_1$-C$_{20}$ alkyl group, a C$_2$-C$_{20}$ alkenyl group, a C$_2$-C$_{20}$ alkynyl group, a C$_1$-C$_{20}$ heteroalkyl group, a C$_6$-C$_{20}$ aryl group, a C$_6$-C$_{20}$ arylalkyl group, a C$_4$-C$_{20}$ heteroaryl group, a C$_5$-C$_{20}$ heteroarylalkyl group, a C$_4$-C$_{20}$ heteroaryloxy group, a C$_5$-C$_{20}$ heteroaryloxyalkyl group, or a C$_5$-C$_{20}$ heteroarylalkyl group, provided that the substituted atom's normal valence is not exceeded.

The term "metal" as used herein refers to a metal such as an alkali metal, an alkaline earth metal, a transition metal, and a basic metal. The term "metal" also includes a semimetal such as Si and the like.

Hereinafter, a luminescent material, a method of preparing the luminescent material, and a light-emitting device including the luminescent material are described in detail with reference to the accompanying drawings.

[Luminescent Material]

In one or more embodiments, a luminescent material may include a first compound represented by Formula 1 and a second compound represented by Formula 2:

  Formula 1

  Formula 2

In Formulae 1 and 2, A, X, and $R_{21}$ to $R_{23}$ are understood by referring to descriptions thereof provided below.

The luminescent material may be a mixture of the first compound and the second compound.

In detail, the first compound may form a crystal, and for example, may be perovskite.

In one or more embodiments, the second compound may be an amine, and for example, may include at least one of a primary amine, secondary amine, or tertiary amine.

In one or more embodiments, the second compound may not be included in the crystal of the first compound. That is, the second compound may be present on a surface of the first compound. The presence of the second compound may be confirmed by XRD analysis as described in Examples below.

An amount of the second compound in the luminescent material may be greater than 0 wt %. In detail, the amount of the second compound in the luminescent material may be greater than about 0 wt %, about 5 wt % or greater, about 10 wt % or greater, about 15 wt % or greater, about 20 wt % or greater, about 30 wt % or greater, about 60 wt % or less, about 70 wt % or less, about 80 wt % or less, or about 90 wt % or less. In particular, when the amount of the second compound in the luminescent material is from about 10 wt % or greater to about 90 wt % or less, the luminescent material may emit blue light.

In Formula 1, A may be $R_{11}R_{12}R_{13}C$, $R_{11}R_{12}R_{13}R_{14}N$, $R_{11}R_{12}N=C(R_{13})$—$NR_{14}R_{15}$, Li, Na, K, Cs, Rb, Fr, or any combination thereof.

Here, $R_{11}$ to $R_{15}$ may each independently be hydrogen, deuterium, —$N(Q_{11})(Q_{12})$, a $C_1$-$C_3$ alkyl group, a $C_2$-$C_3$ alkenyl group, a $C_2$-$C_3$ alkynyl group, or a $C_1$-$C_3$ alkoxy group, and $Q_{11}$ and $Q_{12}$ may each independently be hydrogen, deuterium, a $C_1$-$C_3$ alkyl group, a $C_2$-$C_3$ alkenyl group, a $C_2$-$C_3$ alkynyl group, or a $C_1$-$C_3$ alkoxy group.

For example, $R_{11}$ to $R_{15}$ may each independently be hydrogen, deuterium, —$N(Q_{11})(Q_{12})$, a methyl group, an ethyl group, an iso-propyl group, an n-butyl group, an iso-butyl group, a sec-butyl group, a methoxy group, an ethoxy group, an iso-propoxy group, an n-butoxy group, an iso-butoxy group, or a sec-butoxy group, and $Q_{11}$ and $Q_{12}$ may each independently be hydrogen, deuterium, methyl group, an ethyl group, an iso-propyl group, an n-butyl group, an iso-butyl group, a sec-butyl group, a methoxy group, an ethoxy group, an iso-propoxy group, an n-butoxy group, an iso-butoxy group, or a sec-butoxy group.

In one or more embodiments, A in Formula 1 may be $NH_4$, $CH_3NH_3$, $C_2H_5NH_3$, $(CH_3)_2NH_2$, $CH(NH_2)_2$, Li, Na, K, Rb, Cs, Fr, or any combination thereof.

In one or more embodiments, A in Formula 1 may be $CH_3NH_3$, $CH(NH_2)_2$, Cs, or any combination thereof.

In one or more embodiments, X in Formula 1 may be at least one of F, Cl, Br, I, or any combination thereof.

In one or more embodiments, X in Formula 1 may be Br.

In one or more embodiments, the first compound may be $CsCuBr_3$, $CH_3NH_3CuBr_3$, $CH(NH_2)_2CuBr_3$, or any combination thereof.

In Formula 2, $R_{21}$ to $R_{23}$ may each independently be selected from hydrogen, deuterium, a substituted or unsubstituted $C_1$-$C_{10}$ alkyl group, a substituted or unsubstituted $C_6$-$C_{20}$ aryl group, and a substituted or unsubstituted $C_7$-$C_{20}$ arylalkyl group, wherein at least one of $R_{21}$ to $R_{23}$ may be selected from a substituted or unsubstituted $C_1$-$C_{10}$ alkyl group, a substituted or unsubstituted $C_6$-$C_{20}$ aryl group, and a substituted or unsubstituted $C_7$-$C_{20}$ arylalkyl group, and two substituents selected from $R_{21}$ to $R_{23}$ may optionally be linked to each other to form a ring.

In one or more embodiments, $R_{21}$ to $R_{23}$ in Formula 2 may each independently be:

hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, a phenyl group, a naphthyl group, a benzyl group, a phenylethyl group, a phenylpropyl group, or a phenylbutyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, or an n-decyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a naphthyl group, a benzyl group, a phenylethyl group, a phenylpropyl group, or a phenylbutyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group, wherein at least one of $R_{21}$ to $R_{23}$ may be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, a phenyl group, a naphthyl group, a benzyl group, a phenylethyl group, a phenylpropyl group, or a phenylbutyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, or an n-decyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a naphthyl group, a benzyl group, a phenylethyl group, a phenylpropyl group, or a phenylbutyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group.

In one or more embodiments, $R_{21}$ to $R_{23}$ in Formula 2 may each independently be:

hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group, wherein at least one of $R_{21}$ to $R_{23}$ may be:

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group;

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group.

In one or more embodiments, $R_{21}$ in Formula 2 may be:

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group;

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —C, —Br, —I, a hydroxy group, an amino group, a methyl group, an ethyl group, an n-propyl group, an isopropyl group, an n-butyl group, an isobutyl group, a sec-butyl group, or a tert-butyl group, and $R_{22}$ and $R_{23}$ in Formula 2 may each independently be hydrogen or deuterium.

In one or more embodiments, the second compound may include propylamine, butylamine, isobutylamine, aniline, phenylmethylamine, phenylethylamine, or any combination thereof.

The luminescent material may emit blue light or green light. For example, the luminescent material may emit blue light.

A maximum luminescence wavelength (experimental value) of the luminescent material may be from about 420 nm or greater to about 520 nm or less, for example, may be about 420 nm or greater, about 430 nm or more, about 495 nm or less, about 475 nm or less, or about 450 nm or less. In particular, when the maximum luminescence wavelength of the luminescent material is between about 420 nm and about 475 nm, a light-emitting device having a dark blue emission color may be provided.

A FWHM of the luminescent material may be about 100 nm or less. In detail, the FWHM of the luminescent material may be about 95 nm or less or 90 nm or less. The smaller FWHM the luminescent material has, the higher color purity the light-emitting device has, thereby improving luminescence efficiency within a desired wavelength range.

In the luminescent material, the second compound may compensate for defects at the boundary with the first compound, so that the PL intensity of the luminescent material may be improved.

Currently, inorganic compounds or organic/inorganic composite compounds, which exhibit commercially available performance in terms of luminescence characteristics and/or stability, mostly include elements, such as cadmium, lead, and the like, which may cause environmental problems. However, the luminescent material of the present disclosure may be able to exhibit luminescence characteristics and/or stability at a commercially available level, without including cadmium, lead, and the like, so that the luminescent material of the present disclosure does not cause environmental problems.

A method of preparing the luminescent material may be understood by those of ordinary skill in the art with reference to a preparation method and Synthesis Examples described below.

Preparation Method of Luminescent Material

According to one or more embodiments, a method of preparing the luminescent material including the first compound represented by Formula 1 and the second compound represented by Formula 2 includes: providing a composition (e.g., a mixture) on a substrate, the mixture including at least one A precursor, at least one Cu precursor, a second compound represented by Formula 2, and a solvent; crystallizing the composition by adding an anti-solvent thereto; and removing the solvent and the anti-solvent by heat treatment.

First, a composition including at least one A precursor, at least one Cu precursor, a second compound represented by Formula 2, and a solvent may be provided on a substrate.

The composition does not include a salt of the second compound, such as a compound represented by $R_{21}R_{22}R_{23}NX$. The mixture may be distinguished from a mixture for preparing organic-inorganic hybrid perovskite including a compound represented by $R_{21}R_{22}R_{23}NX$.

The second compound may be in a liquid state at room temperature.

In the composition, an amount of the second compound may be determined according to the finally prepared luminescent material. In one or more embodiments, the amount of the second compound in the composition may be regarded as an amount that is greater than about 10 wt %, or from about 10 wt % or more to about 90 wt % or less, based on the total weight of the composition. In one or more embodiments, an amount of the second compound in the luminescent material may be from about 10 wt % to about 90 wt %, based on the total weight of the luminescent material.

In the composition, a molar ratio of the at least one A precursor to the at least one Cu precursor may be determined according to the compositional makeup of a finally prepared first compound represented by Formula 1. In detail, in the mixture, the molar ratio of the at least one A precursor to the at least one Cu precursor may be from about 0.7:1 to about 1:0.7, and for example, may be about 1:1. In this regard, the first compound represented by Formula 1 may be perovskite.

For example, the composition may be spin-coated on the substrate. When the composition is provided by spin coating, the coating conditions may be selected in consideration of the composition, and for example, may include a coating speed from about 300 revolutions per minute (rpm) to about 6,000 rpm. In detail, the coating speed may be adjusted differently by dividing sections. For example, the coating speed may be maintained between about 300 rpm and about 700 rpm in a first section, and then, may be maintained between about 2,000 rpm and about 6,000 rpm in a second section.

Meanwhile, the composition may be provided on the substrate by applying various other methods, including those known in the art.

The solvent may be chosen from materials having high solubility to the at least one A-containing precursor, the at least one Cu-containing precursor, and the second compound represented by Formula 2. For example, the solvent may be dimethyl formamide, dimethyl sulfoxide (DMSO), γ-butyrolactone, N-methyl-2-pyrrolidone, or any combination thereof. However, embodiments of the present disclosure are not limited thereto.

Next, an anti-solvent is added to the substrate on which the composition is provided to crystallize the composition.

For example, when the composition is provided on the substrate by spin coating, the composition may be spin-coated first, and then, the anti-solvent may be added dropwise or sprayed while continuously rotating the substrate.

The anti-solvent may be chosen from materials having high solubility to the at least one A precursor, the at least one Cu precursor, and the second compound represented by Formula 2. For example, the anti-solvent may be diethyl ether, toluene, α-terpineol, hexyl carbitol (diethylene glycol hexyl ether), butyl carbitol acetate (diethylene glycol n-butyl ether acetate), hexyl cellosolve (ethylene glycol monohexyl ether), butyl cellosolve acetate (ethylene glycol n-butyl ether acetate), or any combination thereof. However, embodiments of the present disclosure are not limited thereto. In detail, the anti-solvent may be diethyl ether.

Next, by heat treatment, the solvent and the anti-solvent may be removed.

For example, the heat treatment conditions may be selected within a time range from 5 minutes to 2 hours and a temperature range from 50° C. to 200° C., in consideration of the composition of the mixture. In detail the heat treatment conditions may be within a time range from 10 minutes to 20 minutes and a temperature range from 100° C. to 150° C.

The A in the A precursor may be the same as described in connection with A in Formula 1 above.

For example, the A precursor may be a halide of A (e.g., (A)(X)), and the Cu precursor may be a Cu halide (e.g., $Cu(X)_2$). In (A)(X) and $Cu(X)_2$, A and X may each be the same as described in connection with Formula 1 above.

Light-Emitting Device

According to one or more embodiments, a light-emitting device 1 includes: a first electrode 110; a second electrode 190 facing the first electrode 110; an emission layer 150 between the first electrode 110 and the second electrode 190, wherein the emission layer 150 includes the luminescent material.

The structure of the light-emitting device 1 will be described with reference to FIG. 1. FIG. 1 is a schematic cross-sectional view of the light-emitting device 1 according to one or more embodiments.

Although not illustrated in FIG. 1, a substrate may be additionally located under or beneath the first electrode 110 (away from the emission layer 150) and/or on or above the second electrode 190 (away from the emission layer 150). For use as the substrate, any substrate that is used in the art of light-emitting devices may be used, and for example the substrate may be a glass substrate or a transparent plastic substrate, each having excellent mechanical strength, thermal stability, transparency, surface smoothness, ease of handling, and water resistance.

The first electrode 110 may be an anode to which a positive (+) voltage is applied, and the second electrode 190 may be a cathode to which a negative (−) voltage is applied. In one or more embodiments, the first electrode 110 may be a cathode, and the second electrode 190 may be an anode. For convenience, one or more embodiments will be described assuming that the first electrode 110 is an anode and the second electrode 190 is a cathode.

The first electrode 110 may be formed by depositing or sputtering a material for forming the first electrode 110 on the substrate. The first electrode 110 may be a reflective electrode, a semi-reflective electrode, or a transmissive electrode. In one or more embodiments, the first electrode 110 may be variously modified. For example, to obtain a bottom emission type light-emitting device, the first electrode 110 may be a semi-transmissive electrode or a transmissive electrode, and to obtain a top emission type light-emitting device, the first electrode 110 may be a reflective electrode. The first electrode 110 may have a single-layered structure or a multi-layered structure including two or more layers.

The material for forming the first electrode 110 may include materials with a high work function to facilitate hole injection. In one or more embodiments, the material for forming the first electrode 110 may include indium tin oxide (ITO), indium zinc oxide (IZO), indium oxide, tin oxide ($SnO_2$), zinc oxide (ZnO), or gallium oxide. In one or more embodiments, the material for forming the first electrode 110 may include at least one of magnesium (Mg), aluminum (Al), aluminum-lithium (Al—Li), calcium (Ca), magnesium-indium (Mg—In), and magnesium-silver (Mg—Ag).

The second electrode 190 opposite to and facing the first electrode 110 may be provided. The second electrode 190 may be a reflective electrode, a semi-reflective electrode, or a transmissive electrode. In one or more embodiments, the second electrode 190 may be variously modified. For example, to obtain a bottom emission type light-emitting device, the second electrode 190 may be a semi-transmissive electrode or a transmissive electrode, and to obtain a top emission type light-emitting device, the second electrode 190 may be a reflective electrode. The second electrode 190 may have a single-layered structure or a multi-layered structure including two or more layers.

The second electrode 190 may include at least one of a metal, an alloy, and an electrically conductive compound, each of which has a relatively low work function. In one or more embodiments, a material for forming the second electrode 190 may include at least one of Li, Mg, Al, Al—Li, Ca, gallium (Ga), Mg—In, and Mg—Ag. For example, the material for forming the second electrode 190 may be ITO or IZO.

The emission layer 150 may include a luminescent material represented by Formula 1 above. In the emission layer 150, electrons and holes transferred by the voltage supplied by the first electrode 110 and the second electrode 190 may be combined together. The electrons and holes are combined together to produce excitons, and then the excitons transition from the excited state to the ground state, thereby emitting light. The light-emitting device 1 may have high color purity, high current efficiency, and high quantum efficiency, due to the inclusion of the luminescent material represented by Formula 1 above.

The luminescent material represented by Formula 1 may be the same as described above.

The luminescent material may be present in a substantially uniform concentration in the emission layer 150, a uniform concentration in the emission layer 150, or may have a concentration gradient in the emission layer 150.

When the light-emitting device 1 is a full color light-emitting device, the light-emitting device 1 may include an emission layer that emits light of a different color for each sub-pixel.

In one or more embodiments, the emission layer may be patterned, for each subpixel, as a first color emission layer, a second color emission layer, and a third color emission layer. When at least one emission layer among the first color emission layer, the second color emission layer, and the third color emission layer may necessarily include the luminescent material. In one or more embodiments, a first color emission layer may be an emission layer that includes the luminescent material, and a second color emission layer and a third color emission layer may be organic emission layers that include different organic compounds from each other. In this regard, the first color to the third color may be different colors from each other, and for example, the first color to the third color may have different maximum luminescence wavelengths from each other. For example, the first color to the third color may be white when combined with each other.

The emission layer may be variously modified, and in one or more embodiments, the emission layer may further include a fourth color emission layer, and at least one emission layer among the first color emission layer to the fourth color emission layer may be an emission layer including the luminescent material, and the other emission layers may be organic emission layers that include different organic compounds from each other. Here, the first color to the fourth color are different colors, and for example, the first color to the fourth color may have different maximum luminescence wavelengths from each other. For example, the first color to the fourth color may be white when combined with each other.

In one or more embodiments, the light-emitting device may have a stacked structure in which two or more emission layers emitting light of different colors from each other contact each other or are separated from each other. The emission layer may be variously modified, and for example, at least one emission layer among the two or more emission layers may be an emission layer including the luminescent material, and the remaining emission layers may each be an organic emission layer including an organic compound.

The emission layer 150 may further include, in addition to the luminescent material represented by Formula 1, organic compounds, other inorganic compounds, an organic/inorganic composite compound. However, embodiments of the present disclosure are not limited thereto.

A thickness of the emission layer 150 may be from about 10 Å to about 200 Å, for example, about 50 Å to about 100 Å. When the thickness of the emission layer 150 is within the range, excellent light-emission characteristics may be obtained without a substantial increase in driving voltage.

The light-emitting device 1 may further include an auxiliary layer between the first electrode 110 and the emission layer 150, between the second electrode 190 and the emission layer 150, or the light-emitting device 1 may further include an auxiliary layer between the first electrode 110 and the emission layer 150 and between the second electrode 190 and the emission layer 150 to improve device characteristics, such as luminescence efficiency, by adjusting the charge carrier balance inside the device. For example, the light-emitting device 1 may further include a hole transport region between the first electrode 110 and the emission layer 150 and an electron transport region between the second electrode 190 and the emission layer 150.

The hole transport region may serve to inject and/or transport holes from the first electrode 110 to the emission layer 150. In addition, the hole transport region may also compensate for an optical resonance distance according to a wavelength of light emitted from the emission layer, and thus, efficiency of a formed organic light-emitting device may be improved.

The hole transport region may include at least one of a hole injection layer, a hole transport layer, or an electron control layer. The hole transport region may have a single-layered structure or a multi-layered structure including two or more layers. For example, the hole transport region may include only either a hole injection layer or a hole transport layer. In one or more embodiments, the hole transport region may have a hole injection layer/hole transport layer structure or a hole injection layer/hole transport layer/electron control layer structure, wherein, for each structure, each layer is sequentially stacked in this stated order from the first electrode 110.

The hole transport region may include, for example, at least one of 1,3-bis(9-carbazolyl)benzene (mCP), 4,4'-bis (N-carbazolyl)-1,1'-biphenyl (CBP), 3,3-bis(carbazol-9-yl) biphenyl (mCBP), 4,4',4"-tris[phenyl(m-tolyl)amino]triphenylamine (m-MTDATA), TDATA, 2-TNATA, N,N'-di(1-naphthyl)-N,N'-diphenyl-(1,1'-biphenyl)-4,4'-diamine (NPB), β-NPB, N,N'-bis(3-methylphenyl)-N,N'-diphenyl-benzidine (TPD), spiro-TPD, spiro-NPB, methylated-NPB, TAPC, HMTPD, tris(4-carbazoyl-9-ylphenyl)amine (TCTA), polyaniline/dodecylbenzene sulfonic acid (Pani/DBSA), poly(3,4-ethylenedioxythiophene)/poly(4-styrene-sulfonate) (PEDOT/PSS), poly(9,9-dioctyl-fluorene-co-N-(4-butylphenyl)-diphenylamine) (TFB), polyarylamine, poly(N-vinylcarbazole) (PVK), polypyrrole, polyaniline/camphor sulfonic acid (Pani/CSA), or (polyaniline)/poly(4-styrenesulfonate) (Pani/PSS). However, embodiments of the present disclosure are not limited thereto:

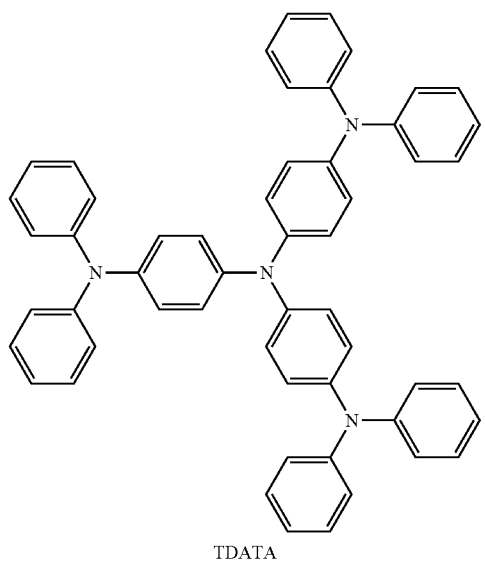

TDATA

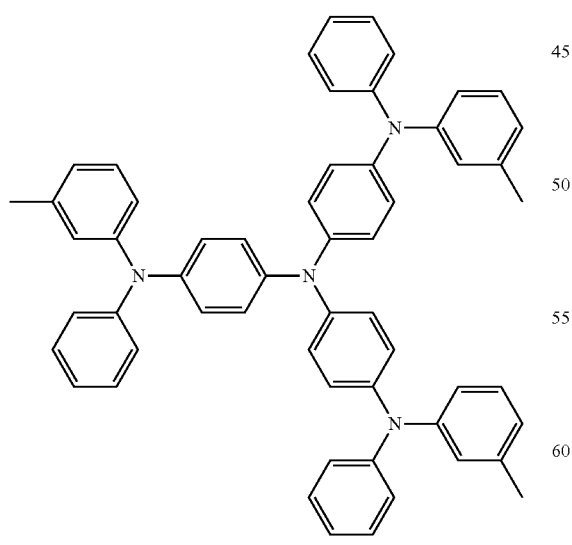

m-MTDATA

2-TNATA

NPB

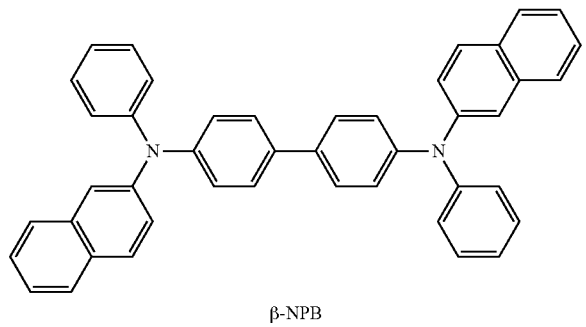

β-NPB

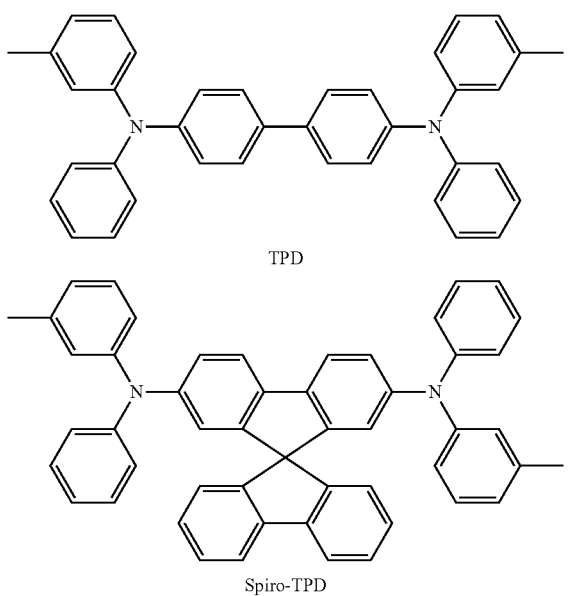

TPD

Spiro-TPD

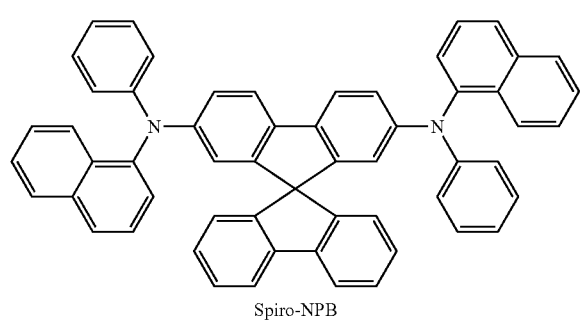

Spiro-NPB

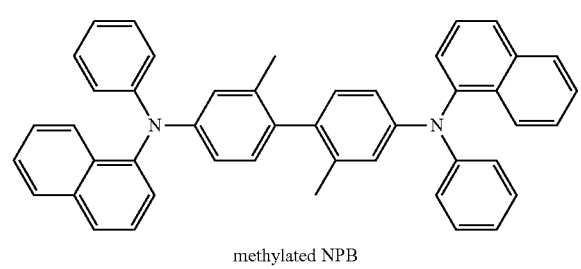

methylated NPB

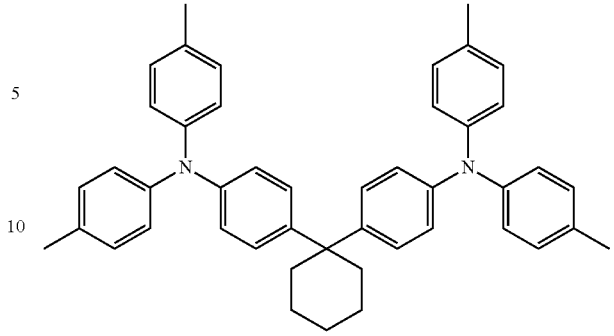

TAPC

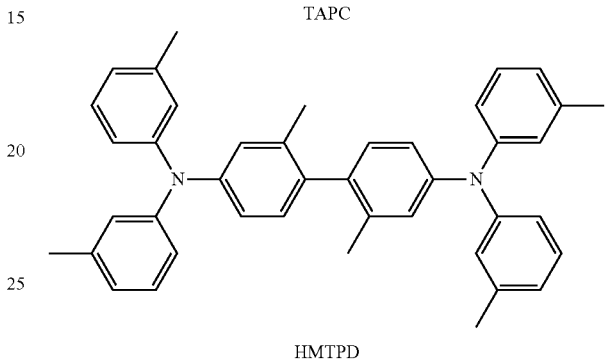

HMTPD

A thickness of the hole transport region may be determined in consideration of the wavelength of light emitted by the emission layer 150, and the driving voltage and current efficiency of the light-emitting device 1. In one or more embodiments, the thickness of the hole transport region may be from about 10 nm to about 1,000 nm, and in one or more embodiments, the thickness of the hole transport region may be from about 10 nm to about 100 nm. When the hole transport region includes both a hole injection layer and a hole transport layer, a thickness of the hole injection layer may be from about 10 nm to about 200 nm, and a thickness of the hole transport layer may be from about 5 nm to about 100 nm.

The hole transport region may further include, in addition to these materials, a p-dopant for the improvement of conductive properties. The p-dopant may be homogeneously or non-homogeneously (e.g., heterogeneously) dispersed in the hole transport region.

The p-dopant may be at least one of a quinone derivative, a metal oxide, or a cyano group-containing compound, but embodiments of the present disclosure are not limited thereto. Non-limiting examples of the p-dopant are a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as dipyrazino[2,3-f:2',3'-h]quinoxaline-2,3,6,7,10,11-hexacarbonitrile (HAT-CN), but embodiments of the present disclosure are not limited thereto.

The electron transport region may inject and/or transport electrons from the second electrode 190 to the emission layer 150. In addition, the electron transport region may also compensate for an optical resonance distance according to a wavelength of light emitted from the emission layer, and thus, efficiency of a formed organic light-emitting device may be improved.

The electron transport region may include at least one of an electron injection layer, an electron transport layer, or a charge control layer. The electron transport region may have a single-layered structure or a multi-layered structure including two or more layers. In one or more embodiments, the electron transport region may include only either an electron injection layer or an electron transport layer. In one or more embodiments, the hole transport region may have a stacked structure of an electron transport layer/electron injection layer or a charge control layer/electron transport layer/electron injection layer, wherein, for each structure, each layer is sequentially stacked in this stated order from the emission layer 150.

The electron transport region may include, for example, at least one of Alq₃, bathocuproine (BCP), 4,7-diphenyl-1,10-phenanthroline (Bphen), bis(2-methyl-8-quinolinolato-N1, O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ) bis(10-hydroxybenzo[h]quinolinato)beryllium (Bebq₂), B3PYMPM, TPBI, 3TPYMB, BmPyPB, TmPyPB, BSFM, PO-T2T, or PO15, but embodiments of the present disclosure are not limited thereto. In one or more embodiments, the electron transport layer and/or the charge control layer may include at least one of these compounds, but embodiments of the present disclosure are not limited thereto.

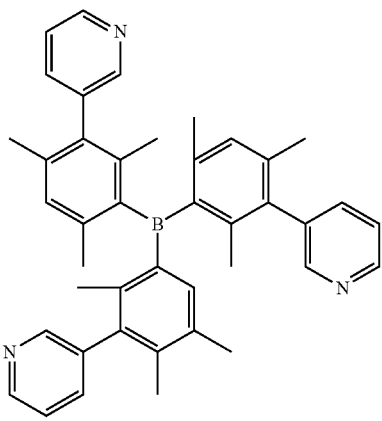

3TPYMB

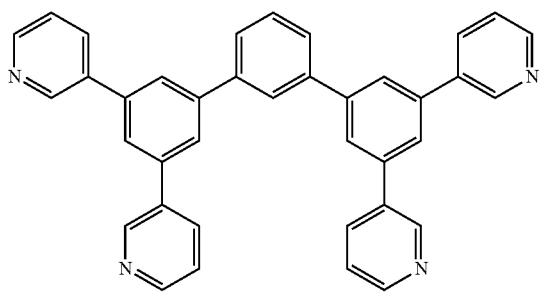

BmPyPB

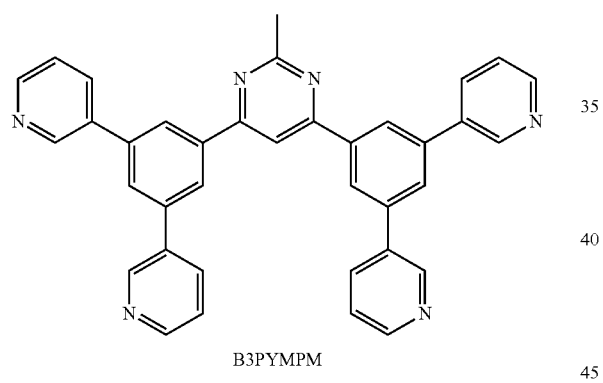

B3PYMPM

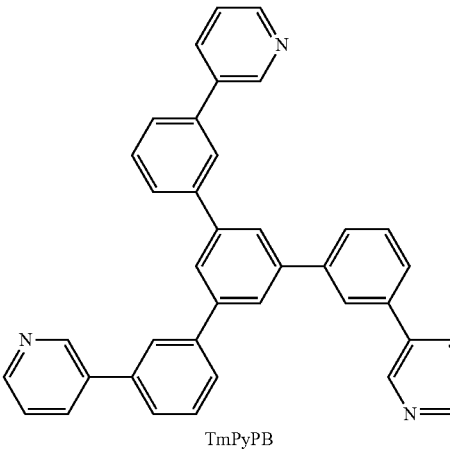

TmPyPB

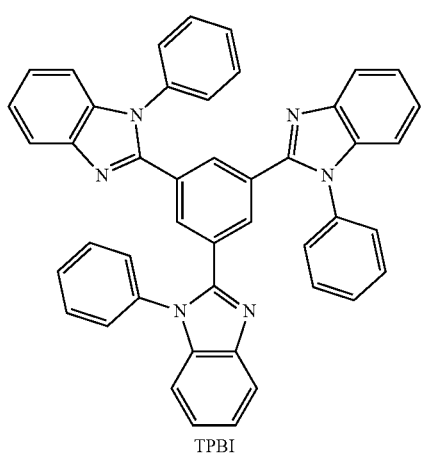

TPBI

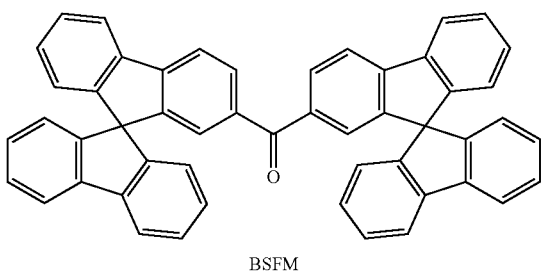

BSFM

-continued

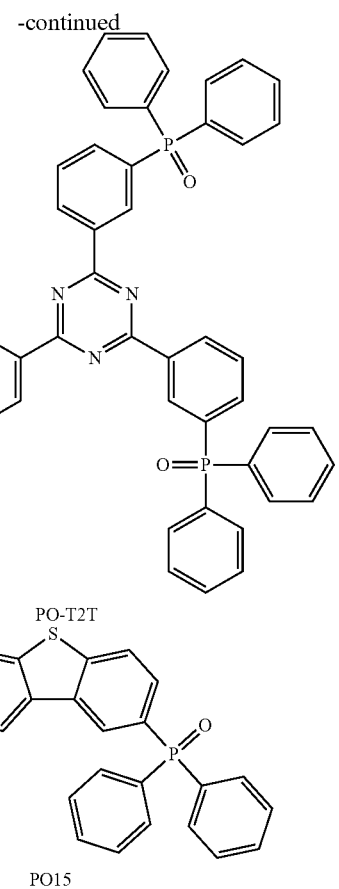

PO-T2T

PO15

In one or more embodiments, the electron injection layer may include at least one of an alkali metal, an alkaline earth metal, a rare earth metal, a compound including an alkali metal, a compound including an alkaline earth-meta, a compound including a rare earth metal, an alkali metal complex, an alkaline earth-metal complex, or a rare earth metal complex, or the electron injection layer may further include the above-described organic compound. However, embodiments of the present disclosure are not limited thereto.

In one or more embodiments, the electron injection layer may include at least one of LiF, NaF, CsF, KF, Li$_2$O, Cs$_2$O, K$_2$O, BaO, SrO, CaO, or 8-quinolinolato lithium (LiQ), or the electron injection layer may further include the above-mentioned organic compound. However, embodiments of the present disclosure are not limited thereto.

A thickness of the electron transport region may be determined in consideration of the wavelength of light emitted by the emission layer 150, and the driving voltage and the current efficiency of the light-emitting device 1. In one or more embodiments, the thickness of the electron transport region may be from about 1 nm to about 1,000 nm, and in one or more embodiment, may be from about 1 nm to about 200 nm. When the electron transport region includes both an electron injection layer and an electron transport layer, a thickness of the electron injection layer may be from about 1 nm to about 50 nm, and a thickness of the electron transport layer may be from about 5 nm to about 100 nm.

The charge control layer may be included to the adjust charge injection balance at an interface between a layer including an organic compound (e.g., a hole transport layer, an electron transport layer, etc.) and a layer including an inorganic compound (e.g., an emission layer). The charge control layer may include, for example, at least one of poly(methyl methacrylate) (PMMA), polyimide (PI), poly-vinyl alcohol (PVA), a combination thereof, or a polymer compound such as a copolymer of these materials. However, embodiments of the present disclosure are not limited thereto. Due to the inclusion of the charge control layer, the charge injection balance of the light-emitting device 1 may be improved, thereby obtaining increased external quantum efficiency. Furthermore, when the charge control layer is directly adjacent to the emission layer 150, the emission layer 150 may be made flat, thereby obtaining lowered driving voltage of the light-emitting device 1.

In one or more embodiments, the light-emitting device 1 may further include a hole transport region between the first electrode 110 and the emission layer 150, an electron transport region between the emission layer 150 and the second electrode 190, or the light-emitting device 1 may further include a hole transport region between the first electrode 110 and the emission layer 150 and an electron transport region between the emission layer 150 and the second electrode 190.

In one or more embodiments, the light-emitting device 1 may include the charge control layer between the first electrode 110 and the emission layer 150, between the emission layer 150 and the second electrode 190, or the light-emitting device 1 may include the charge control layer between the first electrode 110 and the emission layer 150 and between the emission layer 150 and the second electrode 190.

Each layer constituting the light-emitting device 1 may be formed by using suitable methods, such as vacuum deposition, spin coating, casting, Langmuir-Blodgett (LB) deposition, and the like.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed by spin coating, the coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Hereinbefore, the organic light-emitting device 1 has been described with reference to FIG. 1, but embodiments of the present disclosure are not limited thereto.

Hereinafter, a luminescent material, a method of preparing the luminescent material, and a light-emitting device including the luminescent material according to one or more embodiments are described in detail with reference to Synthesis Examples and Examples. However, these examples are for illustrative purposes only and are not intended to limit the content and scope of the present disclosure. The wording "B was used instead of A" as used in describing Synthesis Examples means that an amount of "A" used was identical to an amount of "B" that was used, in terms of a molar equivalent.

EXAMPLES

Analysis Method (1) Measurement of Photoluminescence (PL) Spectrum

A luminescent material was formed on a glass substrate to form a film having a thickness of about 200 nm. The film was excited under a nitrogen atmosphere with excitation-light having a wavelength of 365 nm, and then, a PL spectrum was measured at room temperature by using an ISC PC1 spectrofluorometer.

(2) X-Ray Diffraction (XRD) Analysis

Samples were analyzed within a range from 10° to 50° at a scanning rate of 4°/minute in a 2θ scan mode by using X'pert (available from Philips Company) which is an X-ray diffractometer equipped with a Cu target.

Synthesis Example: Preparation of Luminescent Material

Mixtures 1 to 4 and Comparative Mixture 1 (including, as shown in Table 1 below, an A precursor, a Cu precursor, a second compound, and a solvent at a specified molar ratio and at a specified wt %) were spin-coated on a glass substrate at a rate of 500 rpm for 10 minutes, and then at a rate from 2,000 rpm to 4,000 rpm for 30 seconds. Here, from the time of 25 seconds of the spin coating, diethyl ether was added dropwise at a rate of 2 mL/second for 0.5 seconds. The resulting coated glass substrate was subjected to heat treatment at a temperature of 100° C. for 20 minutes, and then at a temperature of 150° C. for 10 minutes, thereby preparing films having a thickness of about 200 nm according to Examples 1 to 4 and Comparative Example 1 (see Table 2 below).

TABLE 1

| Sample | A precursor | Cu precursor | Second compound | Solvent | Molar ratio (A precursor:Cu precursor:second compound) | Concentration (wt %) |
|---|---|---|---|---|---|---|
| Mixture 1 | CsBr | $CuBr_2$ | Phenylamine | DMSO | 1:0.7:0.2 | 30 |
| Mixture 2 | CsBr | $CuBr_2$ | Phenylamine | DMSO | 1:0.7:0.4 | 29 |
| Mixture 3 | CsBr | $CuBr_2$ | Phenylamine | DMSO | 1:0.7:0.8 | 28 |
| Mixture 4 | CsBr | $CuBr_2$ | Phenylamine | DMSO | 1:0.7:1.5 | 26 |
| Comparative Mixture 1 | CsBr | $CuBr_2$ | — | DMSO | 1:0.7:0 | 31 |

TABLE 2

| Sample | Final product (luminescent material) | Final product | PEA* (wt %) |
|---|---|---|---|
| Mixture 1 | Example 1 | $CsCuBr_3$ + PEA | 11 |
| Mixture 2 | Example 2 | $CsCuBr_3$ + PEA | 22 |
| Mixture 3 | Example 3 | $CsCuBr_3$ + PEA | 45 |
| Mixture 4 | Example 4 | $CsCuBr_3$ + PEA | 90 |
| Comparative Mixture 1 | Comparative Example 1 | $CsCuBr_3$ | 0 |

*PEA is phenylethylamine.

Experimental Example 1: XRD Analysis

Figure 2:
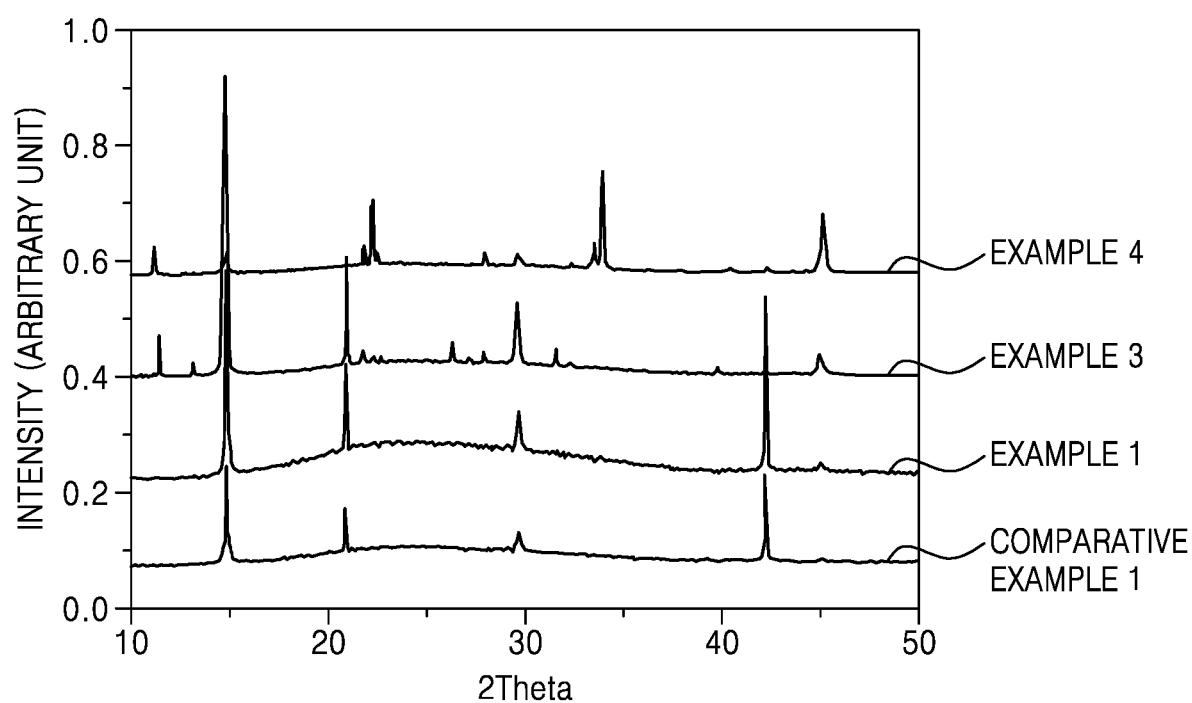
FIG. 2 is a graph of intensity (arbitrary units) versus diffraction angle (degrees 2-theta) showing the X-ray diffraction ("XRD") spectra for Comparative Example 1 and Examples 1, 3, and 4 using 0.1236 Å radiation.

XRD analysis was performed on the films of Examples 1, 3, and 4 and Comparative Example 1, and the results are shown in FIG. 2.

Referring to FIG. 2, it was confirmed that, in the films of Examples 1, 3, and 4, $CsCuBr_3$ had a crystal lattice and PEA was not included in the crystal lattice and only involved in the stabilization at the boundary with the crystal lattice.

Experimental Example 2: Evaluation of Maximum Luminescence Wavelength (PL Max) and Full Width at Half Maximum (FWHM)

Figure 3:
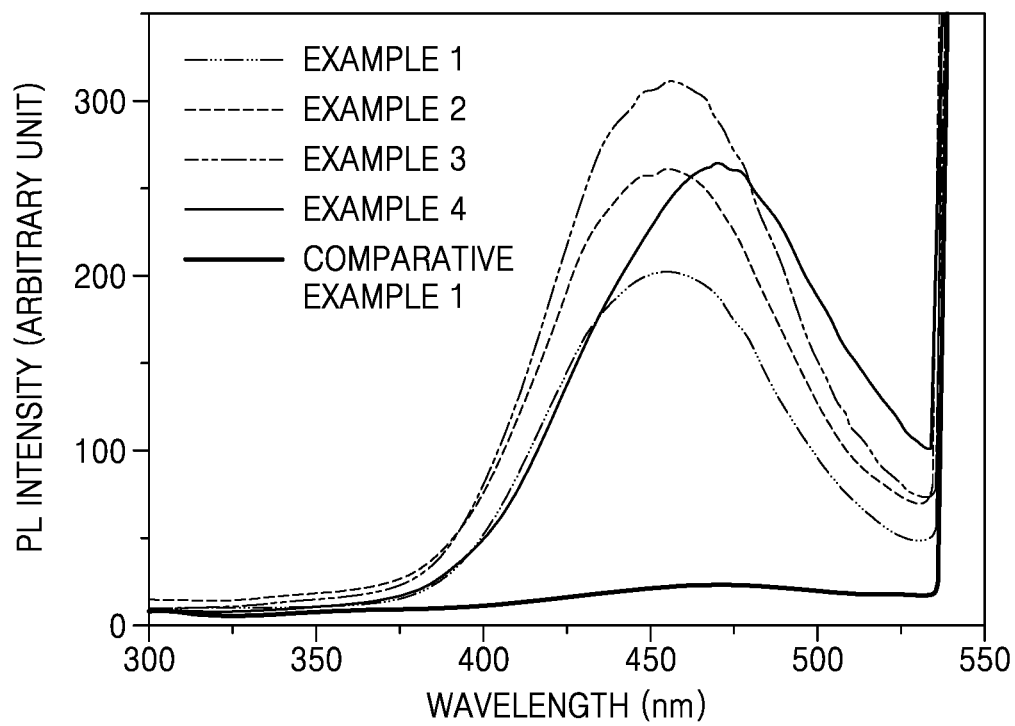
FIG. 3 is a graph of photoluminescence (PL) intensity (arbitrary units, a.u.) versus wavelength (nanometer, nm) showing the photoluminescent spectra for Comparative Example 1 and Examples 1 to 4.

PL spectra were measured for the films of Examples 1 to 4 and Comparative Example 1, and the results are shown in Table 3 and FIG. 3.

TABLE 3

| Compound No. | PL max (nm) | FWHM (nm) |
|---|---|---|
| Example 1 | 455 | 86 |
| Example 2 | 455 | 83 |
| Example 3 | 456 | 80 |
| Example 4 | 471 | 95 |
| Comparative Example 1 | — | — |

Referring to Table 3 and FIG. 3, it was confirmed that the film of Comparative Example 1 did not emit light under these conditions, whereas the films of Examples 1 to 4 emitted blue light and had relatively narrow FWHM.

According to the one or more embodiments, a luminescent material may have improved luminescence characteristics, such as relatively small FWHM value or relatively high luminescence efficiency, and accordingly, a light-emitting device including the luminescent material may have improved color purity and/or improved efficiency.

It should be understood that embodiments described herein should be considered in a descriptive sense only and not for purposes of limitation. Descriptions of features, aspects, or advantages within each embodiment should be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A luminescent material, comprising a first compound represented by Formula 1 and a second compound represented by Formula 2:

[A][Cu][X]$_3$  Formula 1

$R_{21}R_{22}R_{23}N$  Formula 2 wherein, in Formulae 1 and 2,

A is $R_{11}R_{12}R_{13}C$, $R_{11}R_{12}R_{13}R_{14}N$, $R_{11}R_{12}N=C(R_{13})—NR_{14}R_{15}$, Li, Na, K, Cs, Rb$^+$, Fr, or a combination thereof, X is F, Cl, Br, I, or a combination thereof, $R_{11}$ to $R_{15}$ are each independently hydrogen, deuterium, —N($Q_{11}$)($Q_{12}$), a $C_1$-$C_3$ alkyl group, a $C_2$-$C_3$ alkenyl group, a $C_2$-$C_3$ alkynyl group, or a $C_1$-$C_3$ alkoxy group, $Q_{11}$ and $Q_{12}$ are each independently hydrogen, deuterium, a $C_1$-$C_3$ alkyl group, a $C_2$-$C_3$ alkenyl group, a $C_2$-$C_3$ alkynyl group, or a $C_1$-$C_3$ alkoxy group, and $R_{21}$ to $R_{23}$ are each independently hydrogen, deuterium, a substituted or unsubstituted $C_1$-$C_{10}$ alkyl group, a substituted or unsubstituted $C_6$-$C_{20}$ aryl group, or a substituted or unsubstituted $C_7$-$C_{20}$ arylalkyl group, wherein at least one of $R_{21}$ to $R_{23}$ is a substituted or unsubstituted $C_1$-$C_{10}$ alkyl group, a substituted or unsubstituted $C_6$-$C_{20}$ aryl group, or a substituted or unsubstituted $C_7$-$C_{20}$ arylalkyl group, and two substituents from $R_{21}$ to $R_{23}$ are optionally linked to each other to form a ring.

2. The luminescent material of claim 1, wherein the luminescent material is a mixture of the first compound and the second compound.

3. The luminescent material of claim 1, wherein the first compound forms a crystal, and the second compound is not included in the crystal of the first compound.

4. The luminescent material of claim 1, wherein an amount of the second compound in the luminescent material is greater than about 5 wt % or more, based on a total weight of the luminescent material.

5. The luminescent material of claim 1, wherein an amount of the second compound in the luminescent material is from about 10 wt % to about 90 wt %, based on a total weight of the luminescent material.

6. The luminescent material of claim 1, wherein $R_{11}$ to $R_{15}$ are each independently hydrogen, deuterium, —N($Q_{11}$)($Q_{12}$), a methyl group, an ethyl group, an iso-propyl group, an n-butyl group, an iso-butyl group, a sec-butyl group, a methoxy group, an ethoxy group, an iso-propoxy group, an n-butoxy group, an iso-butoxy group, or a sec-butoxy group, and $Q_{11}$ and $Q_{12}$ are each independently hydrogen, deuterium, methyl group, an ethyl group, an iso-propyl group, an n-butyl group, an iso-butyl group, a sec-butyl group, a methoxy group, an ethoxy group, an iso-propoxy group, an n-butoxy group, an iso-butoxy group, or a sec-butoxy group.

7. The luminescent material of claim 1, wherein A is $NH_4$, $CH_3NH_3$, $C_2H_5NH_3$, $(CH_3)_2NH_2$, $CH(NH_2)_2$, Li, Na, K, Rb, Cs, Fr, or a combination thereof.

8. The luminescent material of claim 1, wherein the first compound is $CsCuBr_3$, $CH_3NH_3CuBr_3$, $CH(NH_2)_2CuBr_3$, or a combination thereof.

9. The luminescent material of claim 1, wherein $R_{21}$ to $R_{23}$ are each independently:

hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an iso-heptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, a phenyl group, a naphthyl group, a benzyl group, a phenylethyl group, a phenylpropyl group, or a phenylbutyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, or an n-decyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a naphthyl group, a benzyl group, a phenylethyl group, a phenylpropyl group, or a phenylbutyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group, and wherein at least one of $R_{21}$ to $R_{23}$ is:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, a phenyl group, a naphthyl group, a benzyl group, a phenylethyl group, a phenylpropyl group, or a phenylbutyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, or an n-decyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a naphthyl group, a benzyl group, a phenylethyl group, a phenylpropyl group, or a phenylbutyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group.

10. The luminescent material of claim 1, wherein $R_{21}$ to $R_{23}$ are each independently:

hydrogen, deuterium, a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group;

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group, and wherein at least one of $R_{21}$ to $R_{23}$ is:

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, a tert-hexyl group, a phenyl group, a benzyl group, a phenylethyl group, or a phenylpropyl group;

an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, an n-hexyl group, an isohexyl group, a sec-hexyl group, or a tert-hexyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group; or a phenyl group, a benzyl group, a phenylethyl group, or a phenylpropyl group, each substituted with at least one of deuterium, —F, —Cl, —Br, —I, a hydroxy group, an amino group, a methyl group, an ethyl group, an n-propyl group, an isopropyl group, an n-butyl group, an isobutyl group, a sec-butyl group, or a tert-butyl group.

11. The luminescent material of claim 1, wherein the second compound is propylamine, butylamine, isobutylamine, aniline, phenylmethylamine, phenylethylamine, or a combination thereof.

12. The luminescent material of claim 1, wherein a maximum luminescence wavelength of the luminescent material is from about 420 nanometers to about 520 nanometers.

13. The luminescent material of claim 1, wherein a full width at half maximum of the luminescent material is about 100 nanometers or less.

14. A method of preparing a luminescent material comprising a first compound represented by Formula 1 and a second compound represented by Formula 2, the method comprising:

providing a composition on a substrate, the composition comprising at least one A precursor, at least one Cu precursor, at least one second compound represented by Formula 2, and a solvent;

adding an anti-solvent to the composition;

crystallizing the composition; and removing the solvent and the anti-solvent from the crystallized composition by heat treatment:

[A][Cu][X]$_3$    Formula 1

$R_{21}R_{22}R_{23}N$.    Formula 2 wherein, in Formulae 1 and 2,

A is $R_{11}R_{12}R_{13}C$, $R_{11}R_{12}R_{13}R_{14}N$, $R_{11}R_{12}N=C(R_{13})$—$NR_{14}R_{15}$, Li, Na, K, Cs, Rb, Fr, or a combination thereof, X is F, Cl, Br, I, or a combination thereof, $R_{11}$ to $R_{15}$ are each independently hydrogen, deuterium, —N(Q$_{11}$)(Q$_{12}$), a $C_1$-$C_3$ alkyl group, a $C_2$-$C_3$ alkenyl group, a $C_2$-$C_3$ alkynyl group, or a $C_1$-$C_3$ alkoxy group, $Q_{12}$ are each independently hydrogen, deuterium, a $C_1$-$C_3$ alkyl group, a $C_2$-$C_3$ alkenyl group, a $C_2$-$C_3$ alkynyl group, or a $C_1$-$C_3$ alkoxy group, and $R_{21}$ to $R_{23}$ are each independently hydrogen, deuterium, a substituted or unsubstituted $C_1$-$C_{10}$ alkyl group, a substituted or unsubstituted $C_6$-$C_{20}$ aryl group, and a substituted or unsubstituted $C_7$-$C_{20}$ arylalkyl group, wherein at least one of $R_{21}$ to $R_{23}$ is a substituted or unsubstituted $C_1$-$C_{10}$ alkyl group, a substituted or unsubstituted $C_6$-$C_{20}$ aryl group, or a substituted or unsubstituted $C_7$-$C_{20}$ arylalkyl group, and two substituents from $R_{21}$ to $R_{23}$ are optionally linked to each other to form a ring.

15. The method of claim 14, wherein an amount of the second compound in the composition is regarded as an amount of the second compound from about 10 weight percent or more to about 90 weight percent or less in the luminescent material.

16. The method of claim 14, wherein a molar ratio of the at least one A precursor to the at least one Cu precursor in the composition is about 0.7:1 to about 1:0.7.

17. The method of claim 14, wherein the solvent is dimethyl formamide, dimethyl sulfoxide, γ-butyrolactone, N-methyl-2-pyrrolidone, or a combination thereof, and the anti-solvent is diethyl ether, toluene, α-terpineol, hexyl carbitol (diethylene glycol hexyl ether), butyl carbitol acetate (diethylene glycol n-butyl ether acetate), hexyl cellosolve (ethylene glycol monohexyl ether), butyl cellosolve acetate (ethylene glycol n-butyl ether acetate), or a combination thereof.

18. A light-emitting device, comprising:

a first electrode;

a second electrode opposite to and facing the first electrode; and an emission layer between the first electrode and the second electrode, wherein the emission layer comprises the luminescent material of claim 1.

19. The light-emitting device of claim 18, wherein the light-emitting device further comprises:
- a hole transport region between the first electrode and the emission layer;
- an electron transport region between the emission layer and the second electrode; or
- a hole transport region between the first electrode and the emission layer and an electron transport region between the emission layer and the second electrode.

20. The light-emitting device of claim 18, wherein the light-emitting device further comprises:
- a charge control layer between the first electrode and the emission layer,
- a charge control layer between the emission layer and the second electrode, or
- a charge control layer between the first electrode and the emission layer and a charge control layer between the emission layer and the second electrode.

* * * * *